US009694686B2

(12) United States Patent
Abraham et al.

(10) Patent No.: US 9,694,686 B2
(45) Date of Patent: Jul. 4, 2017

(54) MULTIFUNCTIONAL MONITORING OF ELECTRICAL SYSTEMS

(71) Applicant: CONTINENTAL AUTOMOTIVE GMBH, Hannover (DE)

(72) Inventors: Simon Abraham, Berlin (DE); Friedrich Ramme, Stockelsdorf (DE); Frank Nguyen-Luong, Berlin (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/917,046

(22) PCT Filed: Jul. 23, 2014

(86) PCT No.: PCT/EP2014/065860
§ 371 (c)(1),
(2) Date: Mar. 7, 2016

(87) PCT Pub. No.: WO2015/032546
PCT Pub. Date: Mar. 12, 2015

(65) Prior Publication Data
US 2016/0193926 A1    Jul. 7, 2016

(30) Foreign Application Priority Data

Sep. 5, 2013  (DE) .................. 10 2013 217 748

(51) Int. Cl.
*B60L 3/00* (2006.01)
*B60L 11/18* (2006.01)
(Continued)

(52) U.S. Cl.
CPC ........... *B60L 3/0069* (2013.01); *B60L 3/0023* (2013.01); *B60L 3/0046* (2013.01); *B60L 3/0061* (2013.01);
(Continued)

(58) Field of Classification Search
CPC .... B60L 3/0069; B60L 3/0023; B60L 3/0046; B60L 3/0061; B60L 3/12; B60L 11/12;
(Continued)

(56) References Cited

U.S. PATENT DOCUMENTS 5,450,328 A * 9/1995 Janke ................ G01R 31/42
324/509
6,864,688 B2  3/2005 Beutelschiess et al.
(Continued)

FOREIGN PATENT DOCUMENTS

CN          103048545 A    4/2013
DE            3346387 A1   7/1985
(Continued)

*Primary Examiner* — Marthe Marc-Coleman
(74) *Attorney, Agent, or Firm* — Laurence A. Greenberg; Werner H. Stemer; Ralph E. Locher

(57) ABSTRACT

An apparatus for monitoring and controlling electrical systems in a motor vehicle with electric or hybrid drive has a first and a second AC voltage source for an alternating voltage between a first or second terminal and a reference terminal. First and second voltmeters detect a first or second voltage between the first or second terminal and the reference terminal. A control unit controls the AC voltage sources, receives the voltages from the voltmeters and determines insulation resistance for subassemblies that are connected to the terminals. The insulation resistance is relative to a potential connected to the reference terminal. A precharge state of a capacitative load connected to the first terminal is determined. The load is precharged by a voltage supply unit connected to the second terminal. The switching state of at least one switch between two subassemblies is determined. The subassemblies are connected to the first or second terminal.

10 Claims, 2 Drawing Sheets

(51) Int. Cl.
*B60L 3/12* (2006.01)
*B60L 11/12* (2006.01)
*B60L 15/00* (2006.01)
*B60W 20/50* (2016.01)
*G01R 31/02* (2006.01)
*G01R 31/00* (2006.01)
*G01R 27/02* (2006.01)

(52) U.S. Cl.
CPC ............... *B60L 3/12* (2013.01); *B60L 11/12* (2013.01); *B60L 11/1803* (2013.01); *B60L 11/1864* (2013.01); *B60L 15/007* (2013.01); *B60W 20/50* (2013.01); *B60L 2240/527* (2013.01); *B60L 2240/547* (2013.01); *B60L 2270/20* (2013.01); *G01R 27/025* (2013.01); *G01R 31/006* (2013.01); *G01R 31/025* (2013.01); *Y02T 10/645* (2013.01); *Y02T 10/7005* (2013.01); *Y02T 10/7061* (2013.01); *Y02T 10/7077* (2013.01); *Y10S 903/904* (2013.01)

(58) Field of Classification Search
CPC  B60L 11/1803; B60L 11/1864; B60L 15/007; B60L 2240/527; B60L 2240/547; B60L 2270/20; B60W 20/50; G01R 27/025; G01R 31/025; Y02T 10/645; Y02T 10/7005; Y02T 10/7061; Y02T 10/7077; Y10S 903/904

USPC ............ 701/22; 700/22; 180/65.285, 65.275, 180/65.8

See application file for complete search history.

(56) References Cited

U.S. PATENT DOCUMENTS

| | | | |
|---|---|---|---|
| 6,879,164 | B2 | 4/2005 | Kollenda et al. |
| 9,069,025 | B2 | 6/2015 | Schaefer et al. |
| 9,244,108 | B2 | 1/2016 | Hausberger et al. |
| 2002/0057582 | A1* | 5/2002 | Nakayama ............. B60K 6/445 363/17 |
| 2006/0212745 | A1 | 9/2006 | Zansky et al. |
| 2008/0185999 | A1* | 8/2008 | Matsukawa ........... H02J 7/0077 320/166 |
| 2012/0126839 | A1* | 5/2012 | Schaefer .............. G01R 27/025 324/750.01 |

FOREIGN PATENT DOCUMENTS

| | | | |
|---|---|---|---|
| DE | 10205381 | A1 | 8/2003 |
| DE | 10212493 | A1 | 10/2003 |
| DE | 102006050529 | A1 | 4/2008 |
| DE | 102011108408 | A1 | 1/2013 |
| EP | 2570289 | A1 | 3/2013 |
| JP | 2003169401 | * | 6/2003 |
| JP | 2003169401 | A | 6/2003 |
| WO | 2010136284 | A1 | 12/2010 |

* cited by examiner

MULTIFUNCTIONAL MONITORING OF ELECTRICAL SYSTEMS

BACKGROUND OF THE INVENTION

Field of the Invention

The present invention relates to the technical field of monitoring and control of electrical systems, particularly of electrical systems in a motor vehicle with electric or hybrid drive.

Hybrid or electric vehicle denotes vehicles that are driven entirely or partly by electric power. The power normally comes from an energy storage system, the electrical connection of which to other power circuits either needs to be permanently isolated or can be dynamically switched.

Such vehicles require a series of monitoring and control functions in order to monitor safety-relevant parameters and to actuate the system as appropriate.

By way of example, the effectiveness of the electrical isolation of all power circuits that are permanently or transiently connected to the energy storage system from the vehicle power supply level (charging electronics, power electronics, etc.) needs to be monitored using a sufficiently large resistor from a particular voltage range onward for safety reasons. DE 102 12 493 A1, DE 102 05 381 A1 and DE 10 2006 050 529 describe known systems for insulation monitoring.

Furthermore, incorrect positions at the switches that make and break the connection to the power circuits can unexpectedly result in dangerous voltages. Therefore, such incorrect positions need to be identified as quickly as possible.

Since the power circuit to be connected (electric motor) is a high capacitive load, a precharge process is frequently provided that allows a low-wear switching process. This involves the load side being briefly connected to the source via a series resistor. The short time window means that a level-dependent switch controller is necessary.

BRIEF SUMMARY OF THE INVENTION

The present invention is based on the object of providing improved and simple monitoring of the electrical system of a motor vehicle that is driven entirely or partly electrically.

This object is achieved by the subjects of the independent patent claims. Advantageous embodiments of the present invention are described in the dependent claims.

According to a first aspect of the invention, an apparatus for monitoring and controlling electrical systems in a motor vehicle with electric or hybrid drive is described. The described apparatus has the following: (a) a first AC voltage source for providing an AC voltage between a first connection and a reference connection, (b) a second AC voltage source for providing an AC voltage between a second connection and the reference connection, (c) a first voltmeter for recording a first voltage between the first connection and the reference connection, (d) a second voltmeter for recording a second voltage between the second connection and the reference connection and (e) a control unit that is set up to control the first AC voltage source and the second AC voltage source and to obtain the first voltage from the first voltmeter and the second voltage from the second voltmeter, the control unit additionally being set up to (i) ascertain a first insulation resistance for a first assembly, which is connected to the first connection, and/or a second insulation resistance for a second assembly, which is connected to the second connection, relative to an electrical potential connected to the reference connection, (ii) ascertain a precharge state for a capacitive load that is connected to the first connection and that is precharged by a power supply connected to the second connection, and (iii) ascertain a switching state for one or more switches arranged between two assemblies, one of the two assemblies being connected to the first connection and the other of the two assemblies being connected to the second connection.

The described apparatus is based on the insight that the three functions for ascertaining insulation resistance, precharge state and switching state can be performed by a single apparatus having a central control unit and two independent sets of in each case an AC voltage source and a voltmeter. Hence, the described apparatus allows efficient and inexpensive monitoring of multiple parameters in the electrical system of a motor vehicle with electric or hybrid drive, particularly without the use of single, dedicated monitoring devices for each monitoring function.

In this document, "AC voltage source" denotes particularly a generator for producing an AC voltage having prescribed values for amplitude, frequency and phase.

In this document, "first connection", "second connection" and "reference connection" denote, in particular, single electrical contact points or connection points in a circuit.

In this document, "voltmeter" denotes an apparatus for recording an electrical voltage, particularly an electrical DC voltage and/or an electrical AC voltage, between two contact points.

In this document, "control unit" denotes particularly a central unit having a processor, a memory and interfaces.

In this document, "insulation resistance" denotes particularly the nonreactive resistance component between a contact point of an assembly and a reference potential.

In this document, "precharge state of a capacitive load" denotes particularly the ratio between a present voltage on the load and the voltage that the capacitive load has in the fully charged state.

In this document, "switching state" denotes particularly the state of a switch, that is to say whether the switch provides a connection or no connection between two contact points.

The control unit may be implemented as a standalone unit or as part of another unit. The control unit is particularly set up to actuate the first and second AC voltage sources such that they provide respective AC voltages. The control unit may particularly transmit single values for amplitude, frequency and phase to each AC voltage source. The control unit is additionally set up to obtain measured voltages from the first and second voltmeters. The voltage measurements may be output as digital signals or as analog signals from the voltmeters. In the latter case, the control unit may convert the signals obtained into digital signals. On the basis of the signals obtained from the voltmeters, the control unit can ascertain and store a respective DC voltage component and/or a respective AC voltage component of the first and second voltages.

The control unit is additionally set up to perform three monitoring functions. The first of these monitoring functions is ascertainment of an insulation resistance for a first and/or second assembly that is/are connected to the first connection. The reference used for the insulation resistance measurement is the electrical potential of the reference connection. The second monitoring function is ascertainment of a precharge state for a capacitive load that is connected to the first connection and is precharged by a power supply connected to the second connection. Finally, the third monitoring function is ascertainment of the switching states for one or more switches that is or are arranged between two assemblies in order to selectively connect them to one another and isolate them from one another, one of the assemblies being connected to the first connection and the other assembly being connected to the second connection.

It should be noted that, prior to the performance of one of the three monitoring functions, the relevant assembly or assemblies or capacitive load and power supply need to be connected to the first and second connections. This can be accomplished by means of electronic switches, for example.

In summary, the described apparatus allows monitoring of insulation resistance and switching states for various assemblies and of the precharge state of a capacitive load in a motor vehicle with electric or hybrid drive.

According to one exemplary embodiment of the invention, the control unit is additionally set up to ascertain the first insulation resistance on the basis of the first voltage ascertained by the first voltmeter and/or to ascertain the second insulation resistance on the basis of the second voltage ascertained by the second voltmeter.

According to a further exemplary embodiment of the invention, the control unit is additionally set up to ascertain the precharge state on the basis of a difference between the second voltage ascertained by the second voltmeter and the first voltage ascertained by the first voltmeter.

The capacitive load is usually precharged by switching in a resistor between power supply and load in order to limit the precharge current. The difference between the ascertained second voltage and the ascertained first voltage is therefore dependent on the voltage across this resistor and therefore provides a simple way of computing the precharge state.

According to a further exemplary embodiment of the invention, the control unit is additionally set up to output a control signal to a precharge switch when the difference between the second voltage ascertained by the second voltmeter and the first voltage ascertained by the first voltmeter reaches a precharge threshold value.

The precharge threshold value can particularly correspond to a precharge state of approximately 85% to 95%, particularly 90%. When the desired precharge state has been reached, the control device outputs a control signal to the precharge switch, for example in order to bypass a precharge resistor and couple the load directly to the power supply.

Therefore, when the load is switched on, the described apparatus can contribute, in a simple manner, to its being switched on at the correct time, that is to say when precharging the load has been performed.

According to a further exemplary embodiment of the invention, the control unit is additionally set up to ascertain the switching states by actuating the first and second AC voltage sources, so that the AC voltage provided by the first AC voltage source is inverted in relation to the AC voltage provided by the second voltage source, and to compare the difference between the second voltage ascertained by the second voltmeter and the first voltage ascertained by the first voltmeter with a switching state threshold value.

In this exemplary embodiment, the first and second AC voltage sources are actuated by the control unit such that they provide AC voltages having the same amplitude and frequency but having a phase difference of 180°.

The switching state of the observed switch can then be ascertained on the basis of the difference between the second voltage and the first voltage by comparison with the switching state threshold value.

According to a further exemplary embodiment of the invention, the switching state of the switch is ascertained as connected when the difference between the second voltage ascertained by the second voltmeter and the first voltage ascertained by the first voltmeter is below the switching state threshold value, and the switching state of the switch is ascertained as not connected when the difference between the second voltage ascertained by the second voltmeter and the first voltage ascertained by the first voltmeter is above the switching state threshold value.

In this exemplary embodiment, use is made of the fact that the difference between the voltages is small when the switch is in the connected state, that is to say when it connects the two assemblies to one another, since in this case the first AC voltage source is actually connected to the second AC voltage source directly.

On the other hand, the difference between the voltage is large (equal to twice the amplitude of the two provided AC voltages) when the switch is in the unconnected state, that is to say when it does not connect the two assemblies to one another, since in this case the first AC voltage source and the second AC voltage source cannot influence one another.

Hence, comparison of the difference between the respective AC voltage components of the first voltage and the second voltage provides a simple way of stipulating whether a switch that is situated between the first connection and the second connection is switched on or switched off.

The same principle can furthermore be used to ascertain a switching state for a further switch that can connect the two assemblies but is not installed directly between the first connection and the second connection. This is then accomplished by evaluating a difference between the respective DC voltage components of the first and second voltages. If this difference is small (below a further threshold value), the further switch connects the two assemblies, and if the difference is large (above the further threshold voltage), then the further switch does not connect the two assemblies.

According to a further exemplary embodiment of the invention, the apparatus additionally has a third AC voltage source for providing an AC voltage between a third connection and the reference connection and a third voltmeter for recording a third voltage between the first connection and the reference connection, the control unit additionally being set up to control the third AC voltage source and to obtain the third voltage from the third voltmeter.

It is pointed out that the described apparatus can be extended, according to the invention, by adding further pairs of AC voltage sources and voltmeters that are connected to the control unit, and controlled thereby, in the same way as the previously described first, second and third AC voltage sources and first, second and third voltmeters. Hence, any number of measurement channels can be provided that can be used in pairs to ascertain switch states.

According to a second aspect of the invention, a method for monitoring and controlling electrical systems in a motor vehicle with electric or hybrid drive by means of an apparatus is described, which apparatus has a first AC voltage source, a second AC voltage source, a first voltmeter, a second voltmeter, a first connection, a second connection, a reference connection and a control unit. The described method involves the following: (a) control, by means of the control unit, of the first AC voltage source in order to provide an AC voltage between the first connection and the reference connection, (b) control, by means of the control unit, of the second AC voltage source in order to provide an AC voltage between the second connection and the reference connection, (c) recording of a first voltage between the first connection and the reference connection, (d) recording of a second voltage between the second connection and the reference connection, and (e) on the basis of the recorded first voltage and/or the recorded second voltage: (i) ascertainment of a first insulation resistance for a first assembly, which is connected to the first connection, and/or of a second insulation resistance for a second assembly, which is connected to the second connection, relative to an electrical potential connected to the reference connection, (ii) ascertainment of a precharge state for a capacitive load that is connected to the first connection and that is precharged by a power supply connected to the second connection, and (iii) ascertainment of the switching states for one or more switches arranged between two assemblies, one of the two assemblies being connected to the first connection and the other of the two assemblies being connected to the second connection.

The described method is fundamentally based on the same insight as has been explained above in connection with the first aspect, namely that the three functions for ascertaining insulation resistance, precharge state and switching state can be performed by operating a single apparatus having a central control unit and two independent sets of in each case an AC voltage source and a voltmeter.

The details described in connection with the embodiments above can also be implemented with the method.

According to a third aspect of the invention, a motor controller for a motor vehicle with electric or hybrid drive for the use of a method according to the second aspect and/or one of the exemplary embodiments above is described.

This motor controller allows simple and central monitoring of the electrical system of the motor vehicle.

According to a fourth aspect of the invention, a computer program is described that, when executed by a processor, is set up to perform the method according to the second aspect and/or one of the exemplary embodiments above.

For the purposes of this document, the citation of such a computer program is synonymous with the concept of a program element, a computer program product and/or a computer-readable medium that contains instructions for controlling a computer system in order to coordinate the operation of a system or a method in a suitable manner in order to achieve the effects linked to the method according to the invention.

The computer program may be implemented as a computer-readable instruction code in any suitable programming language, such as in JAVA, C++ etc. The computer program may be stored on a computer-readable storage medium (CD-Rom, DVD, Blu-ray disk, removable drive, volatile or nonvolatile memory, installed memory/processor, etc.). The instruction code can program a computer or other programmable devices, such as particularly a controller for a motor of a motor vehicle, such that the desired functions are performed. In addition, the computer program can be provided in a network, such as the Internet, for example, from which it can be downloaded by a user when required.

The invention can be implemented either by means of a computer program, i.e. a piece of software, or by means of one or more special electrical circuits, i.e. in hardware or in any hybrid form, i.e. by means of software components and hardware components.

It is pointed out that embodiments of the invention have been described with reference to different subjects of the invention. In particular, some embodiments of the invention are described with method claims and other embodiments of the invention are described with apparatus claims. However, it will immediately become clear to a person skilled in the art, on reading this application, that unless explicitly stated otherwise, in addition to a combination of features that belong to one type of subject matter of the invention, any desired combination of features that belong to different types of subjects of the invention is also possible.

Further advantages and features of the present invention will emerge from the exemplary description of a preferred embodiment that follows.

DESCRIPTION OF THE INVENTION

It is pointed out that the embodiments described below are merely a limited selection of possible variant embodiments of the invention.

Figure 1:
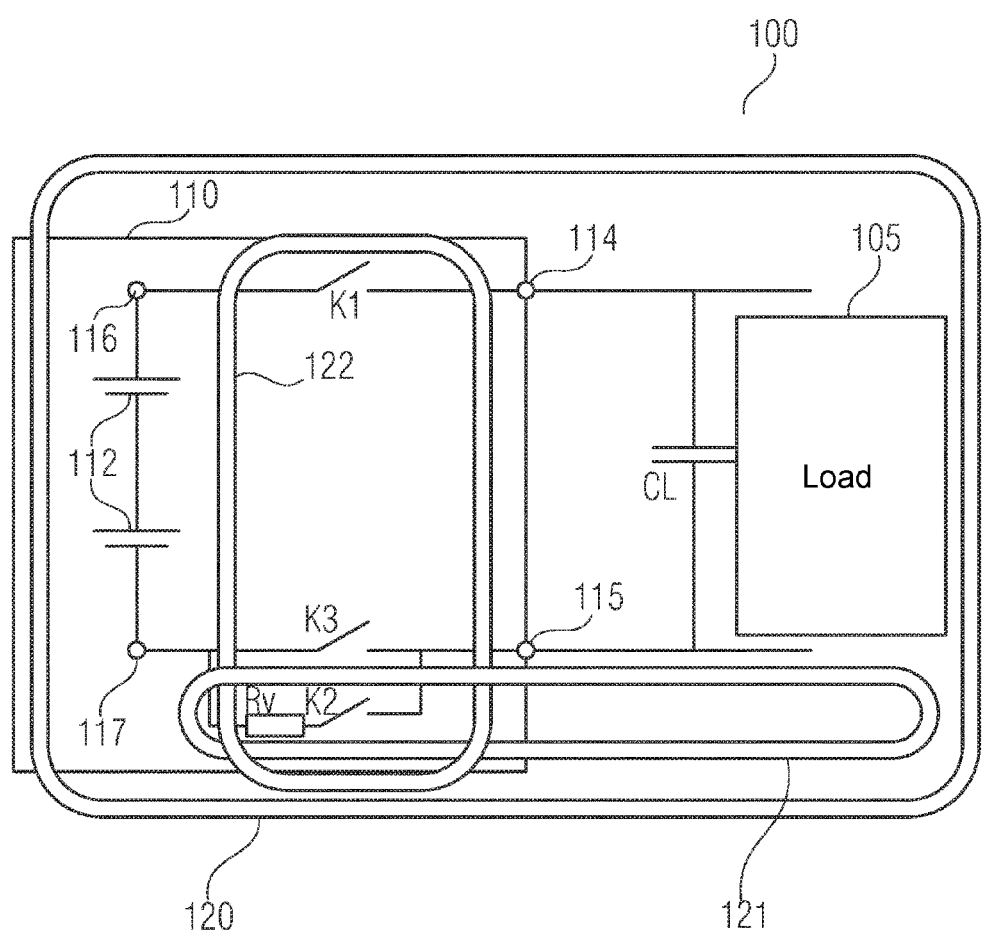
FIG. 1 shows an overview diagram of an electrical system in a motor vehicle with electric or hybrid drive that can be monitored and controlled according to the invention.

FIG. 1 shows a schematic overview diagram of an electrical system 100 in a motor vehicle with electric or hybrid drive that can be monitored and controlled according to the invention. The electrical system 100 has a load 105 and an electrical power supply 110.

The load 105 contains an electric machine for driving a motor vehicle and is highly capacitive. The capacitance of the load is represented schematically as CL and typically has a value of around 1000 µF.

The electrical power supply 110 contains an energy store in the form of a high-voltage battery 112, switches K1 and K3 for connecting and isolating the connection between high-voltage battery 112 and load 105, a precharge resistor Rv and a switch K2 for switching the precharge resistor Rv in and out. In the fully charged state, the high-voltage battery 112 provides a voltage of approximately 360 V, for example. The electrical power supply 110 additionally has connections 114 and 115 for the load 105 and connections 116 and 117 for the high-voltage battery 112. The line 120 shows a region of the system 100 that is relevant to insulation resistance monitoring relative to other electrical systems in a vehicle, such as a vehicle power supply system. The line 121 shows a region of the system 100 that is relevant to precharge state monitoring and control. Finally, the line 122 shows a region of the system 100 that is relevant to switching state monitoring.

Figure 2:
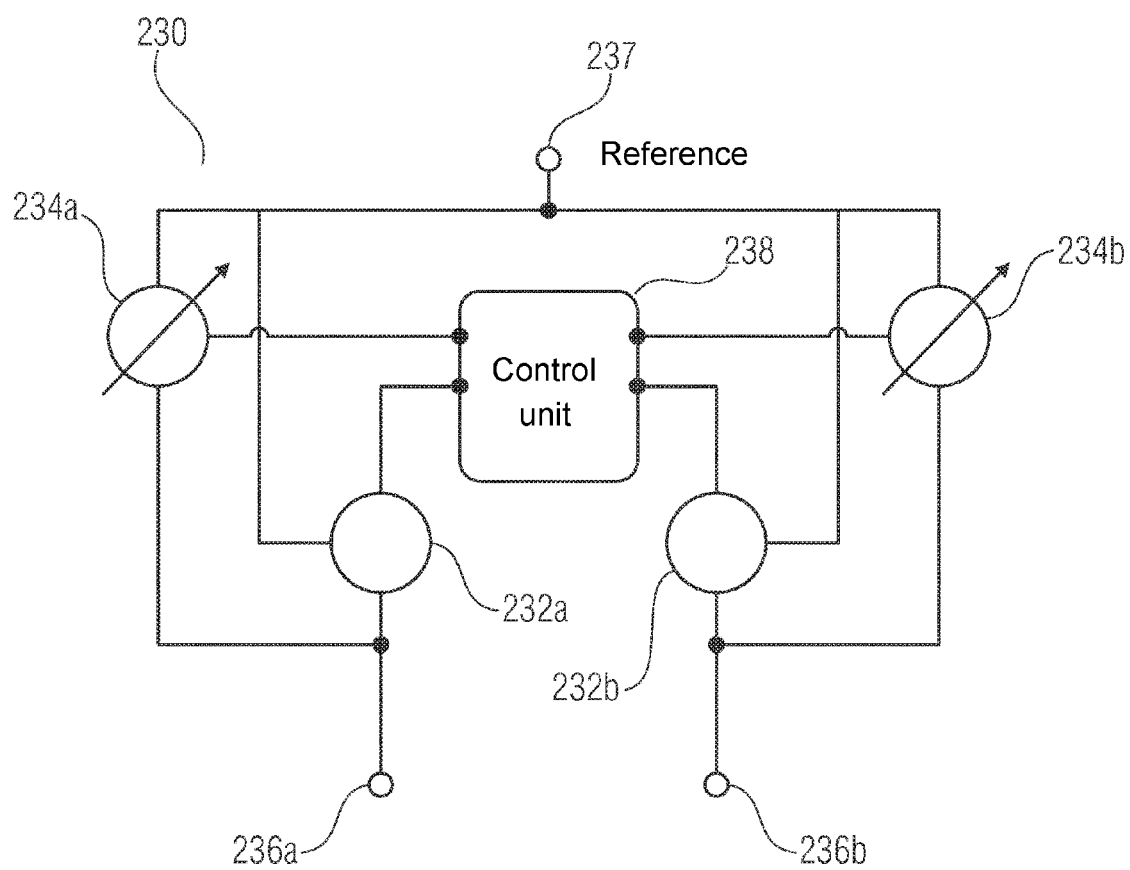
FIG. 2 shows a block diagram of an apparatus according to the invention for monitoring and controlling the electrical system shown in FIG. 1.

FIG. 2 shows a block diagram of an apparatus 230 according to the invention that can be used for monitoring and controlling the electrical system 100 shown in FIG. 1, for example. The apparatus 230 has a first AC voltage source 232a, a first voltmeter 234a and a first connection 236a, which, together with a reference connection 237, form a first measurement channel. The apparatus 230 additionally has a second AC voltage source 232b, a second voltmeter 234b and a second connection 236b, which, together with the reference connection 237, form a second measurement channel.

The apparatus 230 additionally has a control unit 238 that is connected to the AC voltage sources 232a and 232b and to the voltmeters 234a and 234b. The control unit contains processor, memory and interfaces and is set up to control the AC voltage sources 232a and 232b and to obtain measured voltage values from the voltmeters 234a and 234b. In other words, the control unit actuates the first AC voltage source 232a such that it provides an AC voltage having prescribed amplitude, frequency and phase between the first connection 236a and the reference connection 237. The control unit actuates the second AC voltage source 232b in the same way such that it provides an AC voltage having prescribed amplitude, frequency and phase between the second connection 236b and the reference connection 237.

The first voltmeter 234a measures the electrical voltage (DC voltage component and AC voltage component) between the first connection 236a and the reference connection 237 and transmits it to the control unit. The second voltmeter 234b measures the electrical voltage (DC voltage component and AC voltage component) between the second connection 236b and the reference connection 237 and transmits it to the control unit.

The AC voltage sources 232a and 232b and the voltmeters 234a and 234b all have defined impedances with respect to the ground plane of the apparatus 230.

During operation, the apparatus 230 can be used, by way of example, in conjunction with the system 100 shown in FIG. 1 for ascertaining insulation resistances, a precharge state for the load 105, CL and switching states for the switches K1, K2 and K3.

To be more precise, an insulation resistance can be ascertained for the system 100 relative to the vehicle power supply system (not shown) in a motor vehicle as follows: the connection 236a is connected to a connection in the system 100, for example the connection 115, and the reference connection 237 is connected to a connection in the vehicle power supply system (for example ground). The control unit 238 actuates the AC voltage source 232a, so that the latter provides an AC voltage at an amplitude of 120 Vss and a frequency of 0.3 Hz between the connection 236a and the reference connection 237. The voltmeter 234a records the AC voltage drop between the connection 236a and the reference connection 237 and transmits it to the control unit 238. The control unit 238 then computes the corresponding insulation resistance. A similar measurement can be performed using the AC voltage source 232b, the voltmeter 234b and the connection 236b.

The apparatus 230 can be used as follows in order to monitor and control a precharge process for the load CL (in FIG. 1). The first connection 236a is connected to the connection 115, the second connection 236b is connected to the connection 117 and the reference connection 237 is connected to ground (vehicle ground or GND). Hence, the voltage across the precharge resistor Rv can be continuously ascertained by the voltmeters 234a and 234b and transmitted to the control unit 238. The precharge process is initiated by closing the two switches K1 and K2 with switch K3 open. On the basis of the voltage values obtained, the control unit can now track the precharge state and close the switch K3 when a precharge state of 90% is reached, for example. This bypasses the precharge resistor Rv, and the switch K2 can be isolated or opened again, so that the current provided for the load is no longer limited.

Finally, the apparatus 230 can also be used to ascertain a switching state for one or more of the switches K1, K2 and K3 in FIG. 1. For this purpose, the first connection 236a is connected to the connection 117 and the second connection 236b is connected to the connection 115. The control unit 238 actuates the first AC voltage source 232a, so that it provides an AC voltage at an amplitude of 120 Vss and a frequency of 10 Hz between the connection 236a and the reference connection 237. The control unit 238 simultaneously actuates the second AC voltage source 232b, so that it provides an inverted AC voltage between the connection 236b and the reference connection 237, that is to say an AC voltage that is offset by 180° in comparison with the AC voltage between the connection 236a and the reference connection 237. The control unit obtains the voltages (AC voltage components and DC voltage components) recorded by each of the voltmeters 234a and 234b and first of all computes the difference between the AC voltage components obtained, that is to say the difference in the respective positive and negative peak values of the voltages obtained. If this difference is above a prescribed threshold value, the switches K1, K2 and K3 are open. In a typical embodiment, the prescribed threshold value is approximately 5 V. If the difference is equal to zero or lower than the prescribed threshold value, then one of the switches K1, K2 and K3 is closed, that is to say that the connections 117 and 115 are connected directly (K2 or K3 is closed) or indirectly (K1 is closed). In the latter case, the difference between the DC voltage components, that is to say the respective mean values of the voltages obtained, is next computed and compared with a further threshold value. In a typical embodiment, the further threshold value is equal to the aforementioned prescribed threshold value, that is to say approximately 5 V. If the absolute value of the difference between the DC voltage components is above the further threshold value, the switch K1 is closed, that is to say the connections 117 and 115 are connected indirectly. If the absolute value of the difference between the DC voltage components is below the further threshold value, then at least one of the switches K2 and K3 is closed, that is to say that the connections 117 and 115 are connected directly.

The configuration described above can be used to detect the following individual cases: (i) K1 is closed, (ii) K2 or K3 is closed or (iii) K1, K2 and K3 are open. If it is detected that K2 or K3 is closed (ii), then additional measurements can establish whether the switch K1 is closed or open. This can be accomplished by comparing the high voltages of source and sink, that is to say by comparing the voltages for the connections 116 and 114. If these two voltages are the same, then the switch K1 is also closed. If the voltages are different, then the switch K1 is open.

If the precharge state monitoring and control is used only in conjunction with switch-on of the load 105, CL, then insulation resistance and switch states can advantageously be monitored cyclically, so that immediate measures for handling dangerous situations can be used as a result of reduced insulation resistance or an incorrect position of or fault on a switch, for example by dint of output of a warning signal, disconnection of a supply voltage or the like.

In summary, use of the apparatus 230 in a vehicle with hybrid or electric drive allows a series of advantages to be achieved, such as, by way of example:

(1) independent recording of the insulation conditions for a plurality of electrical circuits in respect of the reference potential (usually vehicle ground).

(2) facilitation of the simultaneous detection of the switch states (an additional circuit for this recording function is dispensed with).

(3) integration of the control of the precharge function (an additional circuit for this function is dispensed with).

(4) extended self-test scale on the basis of increased flexibility through independent measurement channels. It is also possible for any measurement channel to have its timing set, and to be operated, individually and in accordance with the impedance conditions.

(5) when insulation of the HV circuit decreases over its life, a channel can be disconnected and isolated from the HV circuit, which improves the resulting overall insulation. The improved insulation allows longer-lasting vehicle operation.

(6) avoidance of additional hardware for detecting the contactor states.
(7) insulation resistance measurement and switching state determination can be performed simultaneously. This allows faster state determination for the HV system.
(8) the number of implementable channels is not limited on principle.
(9) the switching state determination can be performed between all channels in pairs.

In addition, the apparatus described here is summarized briefly below to provide a better overview.

The described apparatus comprises a first and a second AC voltage source for an AC voltage between a respective first or second connection, on the one hand, and a reference connection, on the other. A first and a second voltmeter record a first and a second voltage, respectively, between the first and second connections, on the one hand, and the reference connection on the other. A control unit controls the AC voltage sources, obtains the voltages from the relevant voltmeters and ascertains a first and/or second insulation resistance for a first and/or second assembly that is connected to the relevant connection. This insulation resistance is relative to a potential connected to the reference connection. A precharge state of a capacitive load connected to the first connection is ascertained, which capacitive load is precharged by a power supply connected to the second connection. The switching state for at least one switch arranged between two assemblies is ascertained. The assemblies are connected to the first and second connections.

LIST OF REFERENCE SYMBOLS

100 Electrical system
105 Load
110 Electrical power supply
112 High-voltage battery
114 Connection
115 Connection
116 Connection
117 Connection
120 Line
121 Line
122 Line
K1 Switch
K2 Switch
K3 Switch
Rv Precharge resistor
CL Capacitance
230 Apparatus
232a AC voltage source
232b AC voltage source
234a Voltmeter
234b Voltmeter
236a Connection
236b Connection
237 Reference connection
238 Control unit

The invention claimed is:
1. An apparatus for monitoring and controlling electrical systems in a motor vehicle with electric or hybrid drive, the apparatus comprising:
a first AC voltage source for providing an AC voltage between a first connection and a reference connection;
a second AC voltage source for providing an AC voltage between a second connection and the reference connection;
a first voltmeter for acquiring a first voltage between the first connection and the reference connection;
a second voltmeter for acquiring a second voltage between the second connection and the reference connection; and
a control unit connected to and configured to control said first AC voltage source and said second AC voltage source and to obtain the first voltage from said first voltmeter and the second voltage from said second voltmeter, said control unit being configured to:
(i) ascertain at least one of a first insulation resistance for a first assembly connected to said first connection or a second insulation resistance for a second assembly connected to said second connection, relative to an electrical potential connected to said reference connection;
(ii) ascertain a precharge state for a capacitive load connected to said first connection and precharged by a power supply connected to said second connection; and
(iii) ascertain switching states for one or more switches arranged between two assemblies, wherein one of the two assemblies is connected to said first connection and the other of the two assemblies is connected to said second connection.

2. The apparatus according to claim 1, wherein said control unit is configured to ascertain at least one of the first insulation resistance on a basis of the first voltage acquired by said first voltmeter or the second insulation resistance on a basis of the second voltage acquired by said second voltmeter.

3. The apparatus according to claim 1, wherein said control unit is configured to ascertain the precharge state on a basis of a difference between the second voltage acquired by said second voltmeter and the first voltage acquired by said first voltmeter.

4. The apparatus according to claim 3, wherein said control unit is configured to output a control signal to a precharge switch when the difference between the second voltage acquired by said second voltmeter and the first voltage acquired by said first voltmeter reaches a precharge threshold value.

5. The apparatus according to claim 1, wherein said control unit is configured to ascertain the switching states by actuating said first and second AC voltage sources, so that the AC voltage provided by said first AC voltage source is inverted in relation to the AC voltage provided by said second voltage source, and to compare the difference between the second voltage acquired by said second voltmeter and the first voltage acquired by said first voltmeter with a switching state threshold value.

6. The apparatus according to claim 5, wherein the switching state of said switch is determined to be connected when the difference between the second voltage acquired by said second voltmeter and the first voltage acquired by said first voltmeter lies below the switching state threshold value, and wherein the switching state of said switch is determined to be not connected when the difference between the second voltage acquired by said second voltmeter and the first voltage acquired by said first voltmeter lies above the switching state threshold value.

7. The apparatus according to claim 1, which further comprises:
a third AC voltage source for providing an AC voltage between a third connection and the reference connection; and
a third voltmeter for recording a third voltage between said third connection and the reference connection; and wherein said control unit is connected to and configured to control said third AC voltage source and to obtain the third voltage from said third voltmeter.

8. A method for monitoring and controlling electrical systems in a motor vehicle with electric or hybrid drive by way of an apparatus with a first AC voltage source, a second AC voltage source, a first voltmeter, a second voltmeter, a first connection, a second connection, a reference connection and a control unit, the method comprising:

controlling, with the control unit, the first AC voltage source in order to provide an AC voltage between the first connection and the reference connection;

controlling, with the control unit, the second AC voltage source in order to provide an AC voltage between the second connection and the reference connection;

measuring a first voltage between the first connection and the reference connection;

measuring a second voltage between the second connection and the reference connection; and based on the measured first voltage and/or the measured second voltage:

(i) ascertaining at least one of a first insulation resistance for a first assembly, which is connected to the first connection, or of a second insulation resistance for a second assembly, which is connected to the second connection, relative to an electrical potential connected to the reference connection, (ii) ascertaining a precharge state for a capacitive load that is connected to the first connection and that is precharged by a power supply connected to the second connection; and (iii) ascertaining the switching states for one or more switches arranged between two assemblies, one of the two assemblies being connected to the first connection and the other of the two assemblies being connected to the second connection.

9. A motor controller for a motor vehicle with electric or hybrid drive configured to carry out the method according to claim 8.

10. A computer program, comprising computer code in non-transitory form which, when executed by a processor, is configured to perform the method according to claim 8.

* * * * *